Dec. 15, 1959 J. W. DANIELS 2,917,676
ELECTRICAL CHASSIS MOUNTING CONSTRUCTION OR THE LIKE
Filed July 22, 1955
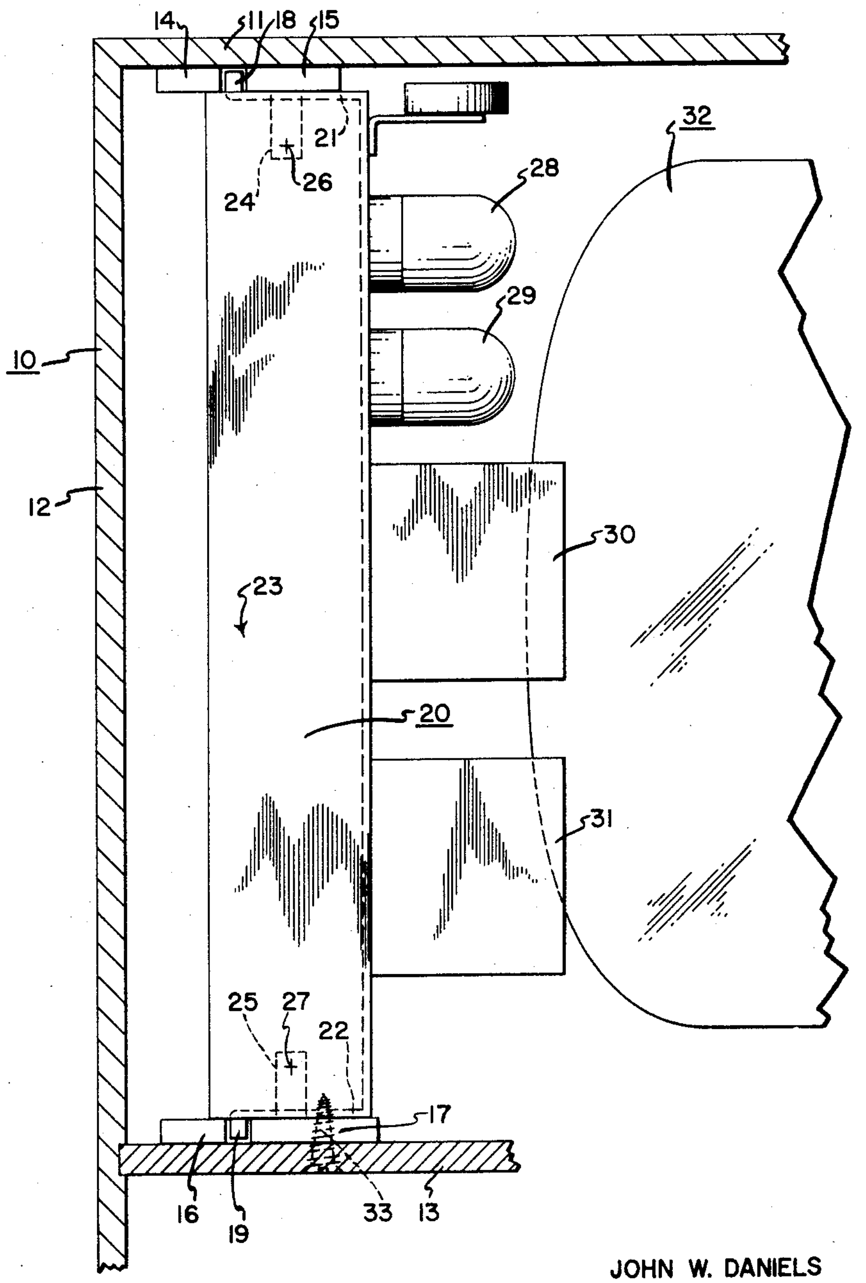
JOHN W. DANIELS
*INVENTOR.*
BY [signature]
HIS ATTORNEY United States Patent Office 2,917,676
Patented Dec. 15, 1959

2,917,676

ELECTRICAL CHASSIS MOUNTING CONSTRUCTION OR THE LIKE

John W. Daniels, Alhambra, Calif., assignor to Hoffman Electronics Corporation, a corporation of California Application July 22, 1955, Serial No. 523,866

1 Claim. (Cl. 317—99)

This invention is related to electrical chassis mounting constructions and, more particularly, to an improved system for mounting electrical chassis which will facilitate conservation of space and also provide convenient accessibility for maintenance.

Over the years there have been developed numerous methods for mounting electrical chassis and sub-chassis in associated cabinet structures or housings. Consider the mounting of television chassis, for example. Conventionally, television chassis have been disposed horizontally immediately below the television picture tube. Of recent date there has been the development of mounting a television chassis in its associated cabinet in perpendicular disposition, that is, adjacent one of the sides of the television cabinet. Vertical chassis mounting has achieved considerable attention because a great deal of space is saved by the employment thereof. In mounting vertically the television set chassis, the vacuum tubes are mounted on the chassis towards the front of the set, whereas the large items such as transformers are situated on the chassis toward the rear, where the periphery of the associated cathode ray tube becomes increasingly constrictive. The television set manual controls are accordingly mounted in a vertical line adjacent one side of the television cabinet. By such a vertical mounting construction the cabinet enclosure is left principally for enclosing the television picture tube. It would, of course, be highly desirable if the television chassis might be slidably disposed in its vertical orientation so that, upon sliding the vertical chassis in a direction away from the cabinet front, servicing of both sides of the chassis would be made possible.

Therefore, it is an object of the present invention to provide a new and useful electrical chassis mounting construction.

It is a further object of the present invention to provide a new and useful electrical chassis mounting construction in which a vertically oriented chassis is slidably disposed in the mount thereof and is capable of being partially or wholly removed for servicing.

It is an additional object of the present invention to provide a new and useful electrical chassis mounting construction in which the chassis itself has a two-flange construction adapted for cooperation with vertical grooves in the mounting structure, but with the weight of the chassis being borne by one of two rails forming the lower groove and not by the lower flange itself.

According to the present invention, an electrical chassis such as a television chassis is oriented vertically in an associated cabinet or housing and is provided with tongue-in-groove mountings above and below. The chassis is slidably disposed within the cabinet and thus is capable of being partially or totally removed therefrom. The chassis design itself is such as to insure that the weight of the chassis and components associated therewith is disposed upon one of the lower runners constituting the lower groove only and not upon the lower flange of the chassis itself.

The features of the present invention which are believed to be novel are set forth with particularity in the appended claim. The present invention, both as to its organization and manner of operation, together with further objects and advantages thereof, may best be understood by reference to the following description, taken in connection with the accompanying drawing, in which:

The sole figure is an elevational view of a portion of a television chassis as mounted within its associated cabinet according to the present invention.

In the sole figure, television cabinet 10 is comprised in part of top 11, side 12, and brace 13. Rather than extending clear across the width of cabinet 10, brace 13 may simply comprise a relatively narrow board supported at either end by L-brackets. Runners 14 and 15, 16 and 17 define slot areas with which flanges 18 and 19 cooperate, respectively. Flanges 18 and 19 are integral portions of chassis 20, being bent 90° from sides 21 and 22. Sides 21 and 22 are joined to sides 23 by means of tabs 24 and 25 and rivets 26 and 27. It is to be noted that flanges 18 and 19 are slightly removed from the inner surface of top 11 and brace 13, respectively, so as not to interfere therewith when the chassis is being slid in and out of cabinet 10. Of primary importance in the design is the feature that substantially the entire weight of the chassis and components mounted thereupon rests upon runner 17. Small elements mounted upon the chassis such as vacuum tubes 28 and 29 may be positioned on the chassis near the front part of the set whereas larger chassis components such as transformers 30 and 31 may be placed to the rear of the television set, so as to not interfere with television picture tube 32. Sheet metal screws 33 may be provided to secure the chassis to the television cabinet to prevent the inadvertent sliding thereof during shipment, etc.

While particular embodiments of the present invention have been shown and described, it will be obvious to those skilled in the art that changes and modifications may be made without departing from this invention in its broader aspects, and, therefore, the aim in the appended claim is to cover all such changes and modifications as fall within the true spirit and scope of this invention.

I claim:

In a cabinet for a television receiver in which the cabinet has at least a top, bottom and side panel, the picture tube within the cabinet having its neck portion extending rearwardly substantially parallel to the panels, a pair of runners having planar exposed surfaces attached to each of the top and bottom panels adjacent to and parallel with the said side panel of the cabinet, the runners of each pair being horizontally spaced to provide a groove between them, a vertically arranged receiver chassis mounted in said cabinet and having a first substantially vertical wall parallel to the said side panel of the cabinet for supporting electrical components thereon projecting toward the neck of the tube, a horizontal upper and lower side wall projecting from the first wall toward the said side panel of the cabinet, and a vertically projecting flange on each horizontal wall at a distance from the first wall of the chassis for entry in the top and bottom grooves respectively, said flange on the lower horizontal wall being of a height which is less than the depth of the corresponding groove, whereby the weight of the chassis is supported on its bottom horizontal wall.

(References on following page)

References Cited in the file of this patent

UNITED STATES PATENTS

| | | |
|---|---|---|
| 293,701 | Baker | Feb. 19, 1884 |
| 1,883,893 | Flaherty | Oct. 25, 1932 |
| 2,068,844 | Ciccarelli | Jan. 26, 1937 |
| 2,077,160 | Wilson | Apr. 13, 1937 |
| 2,189,874 | Ziganke | Feb. 13, 1940 |
| 2,281,958 | Snavely | May 5, 1942 |
| 2,488,372 | Breisch | Nov. 15, 1949 |
| 2,555,039 | Bissonette | May 29, 1951 |
| 2,583,586 | Miller | Jan. 29, 1952 |
| 2,594,565 | Kenney | Apr. 29, 1952 |